METHOD OF DIVIDING A SEMICONDUCTOR WAFER

Filed Dec. 1, 1969 3 Sheets-Sheet 1

Inventor:
Dieter Gerstner

BY Spencer & Kaye
ATTORNEYS.

METHOD OF DIVIDING A SEMICONDUCTOR WAFER

Filed Dec. 1, 1969 3 Sheets-Sheet 2

Inventor:
Dieter Gerstner

BY Spencer & Kaye
ATTORNEYS.

Inventor:
Dieter Gerstner
BY Spencer & Kaye
ATTORNEYS.

United States Patent Office 3,673,016
Patented June 27, 1972

3,673,016
METHOD OF DIVIDING A SEMICONDUCTOR WAFER

Dieter Gerstner, Willsbach, Germany, assignor to Telefunken Patentverwertungsgesellschaft m.b.H., Ulm (Danube), Germany Filed Dec. 1, 1969, Ser. No. 881,151
Claims priority, application Germany, Dec. 2, 1968, P 18 12 129.4
Int. Cl. H01l 7/50
U.S. Cl. 156—6 7 Claims

ABSTRACT OF THE DISCLOSURE

A method of dividing a semiconductor wafer having a plurality of components or circuits at one face of the wafer comprising partially sawing the wafer from the opposite face of the wafer along lines for the division of the wafer into individual components or circuits so that along these lines the thickness of the wafer is reduced in comparison to the remainder of the wafer, and etching the sawn face of the wafer without the use of a mask to complete the division. The method is particularly suitable for use with wafers, having thick self supporting conducting paths which extend over the surface of the wafer and are connected to the electrodes of the components or circuits.

BACKGROUND OF THE INVENTION

The invention relates to a method of dividing a semiconductor wafer which contains a plurality of components or circuits and in particular to a method of dividing a semiconductor wafer in which, self-supporting conducting paths extend over the surface of the wafer and are connected to the electrodes of the components or circuits.

For some time, semiconductor components and semiconductor circuits have been known which include, at one surface of a semiconductor wafer, thick, self-supporting conducting paths which project beyond the edge of the semiconductor body or wafer in the finished product. These conducting paths, which are also frequently termed "beam leads" in the literature, generally consist of a plurality of layers of conducting paths situated one above the other and may be 12 to 15 $\mu$m. thick for example. Since the conducting paths project beyond the semiconductor bodies, they can easily be connected to other connecting members and the "beam leads" are sufficiently stable to carry the semiconductor body. The beam-lead technique is also used for the production of integrated semiconductor circuits. In this case, the semiconductor material between semiconductor regions, which contain semiconductor components to be electrically insulated from one another, has been removed by etching after the electrical connections have been established by means of thick "beam-lead conducting paths" at one surface of the original semiconductor body. In this manner, a semiconductor device is obtained which is composed of individual semiconductor bodies which are only held together by thick conducting paths, and these conducting paths impart the necessary mechanical stability to the finished system. In the manufacture of "beam-lead devices," the semiconductor wafers, on which a plurality of similar semiconductor components or semiconductor circuits are generally produced by means of the planar technique, have to be divided by etching from the surface which is opposite to the surface over which the conducting paths extend. On the other hand, the semiconductor wafers cannot be scored and broken up because in this case there would be no conducting paths projecting beyond the semiconductor body and the conducting paths themselves would be destroyed.

Materials are known which are resistant to etching and are used for the masking during the production of semiconductor components. Thus lacquer masks, which are produced by photolithography in a known manner, are often used to cover those parts which are not to be attacked by the etching liquid. However this masking technique is suitable only for short etching times because with prolonged etching, the photolacquer is dissolved or removed. This etching technique is unsuitable or the manufacture of "beam-lead devices" because in this case a semiconductor wafer having a thickness of 200 to 300 $\mu$m. has to be etched through.

SUMMARY OF THE INVENTION

According to the invention, there is provided a method of dividing a semiconductor wafer containing a plurality of components or circuits at one face of said semiconductor wafer. The method comprises partially sawing the other face of the semiconductor wafer along lines for the division of said semiconductor wafer so that along these lines the remaining semiconductor material is thin in relation to the remainder of the semiconductor wafer. After this is done the semiconductor wafer is etched on its sawn face without the use of a mask so as to divide the wafer into individual components.

BRIEF DESCRIPTION OF THE DRAWINGS

The invention will now be described in greater detail, by way of example, with reference to the accompanying drawings, in which.

DESCRIPTION OF THE PREFERRED EMBODIMENTS

Figures 1, 2:
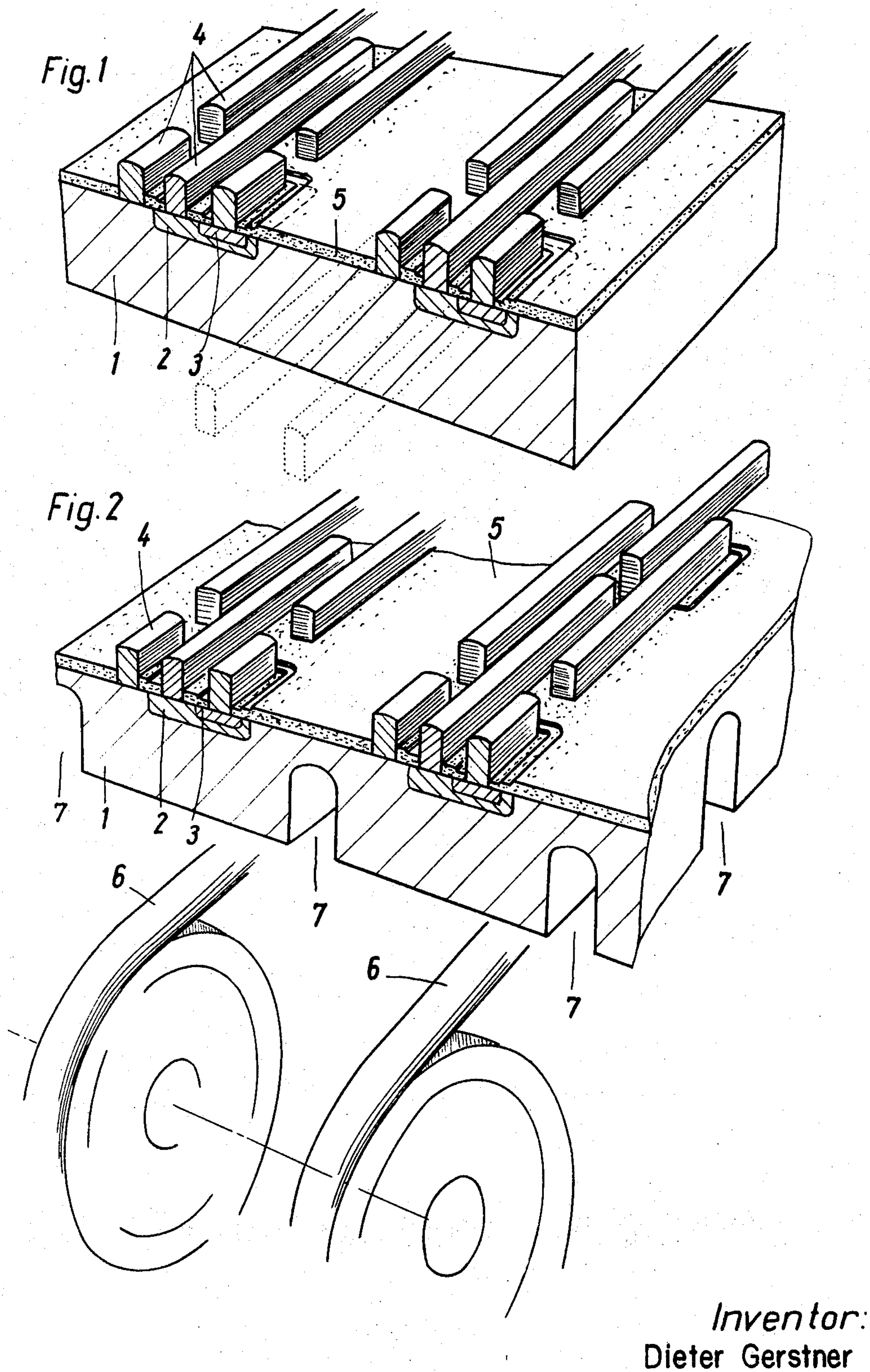
FIG. 1 is a perspective view, partially in section, of a portion of a semiconductor wafer to which the method of the invention is to be applied.
FIG. 2 is a view similar to FIG. 1 but showing the semiconductor wafer partially sawn by gang saws.

Referring to FIG. 1, there is shown a portion of a semiconductor wafer 1, for example of silicon, out of which a plurality of similar planar transistors are produced. For this purpose, the semiconductor of the first type of conductivity is covered with a diffusion-inhibiting layer 5, for example of silicon dioxide. Then impurities are diffused into the semconductor body through diffusion windows introduced into the oxide layer 5 by means of the known photolacquer and masking technique, and produce base regions 2 of the second type of conductivity in the semiconductor body. Finally, emitter regions 3 are diffused into these base regions. Contact-making windows, in which the conducting paths 4 extending over the oxide layer 5 are in electrical contact with the regions of the semiconductor components, are introduced into the oxide layer which is closed again. The conducting paths 4, which extend parallel to one another, are generally multi-layer and consist, for example, of a sequence of layers of titanium-platinum-gold, in which the layer of gold is thick in comparison with the other layers and having been electrodeposited.

FIG. 2 illustrates part of a gang saw consisting of two wires 6, by means of which parallel channels 7 are formed in the semiconductor body from the rear surface of the semiconductor wafer opposite to the conducting paths. With a total thickness of the semiconductor wafer of 200 $\mu$m., these channels may be 170 $\mu$m., deep for example.

Figure 3:
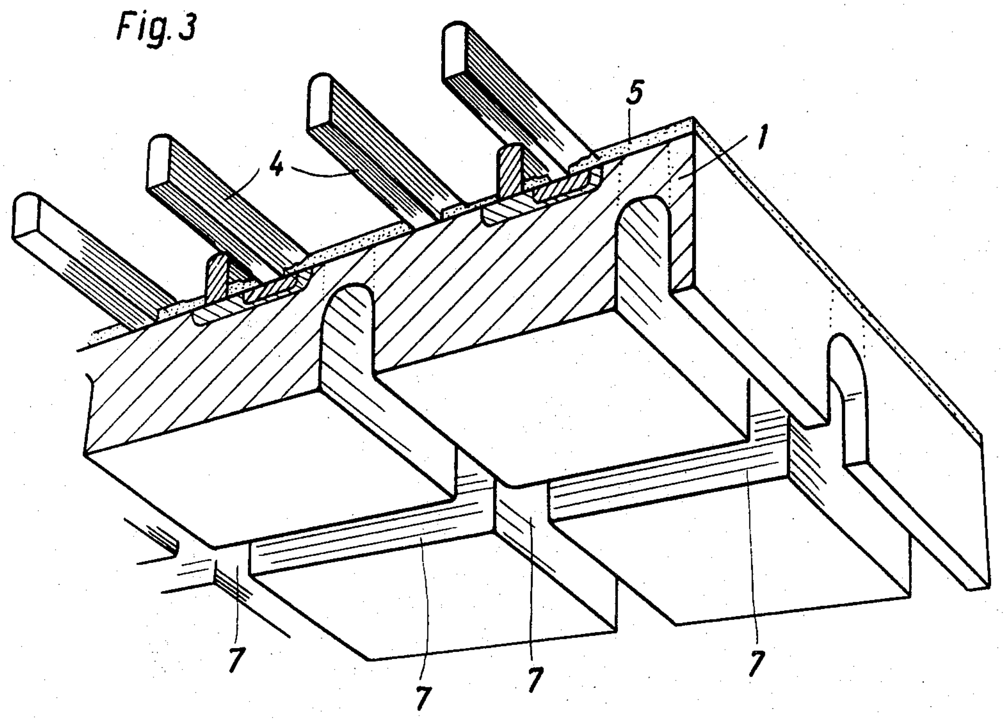
FIG. 3 is a perspective view of the semiconductor wafer which has been partially sawn.
Figure 4:
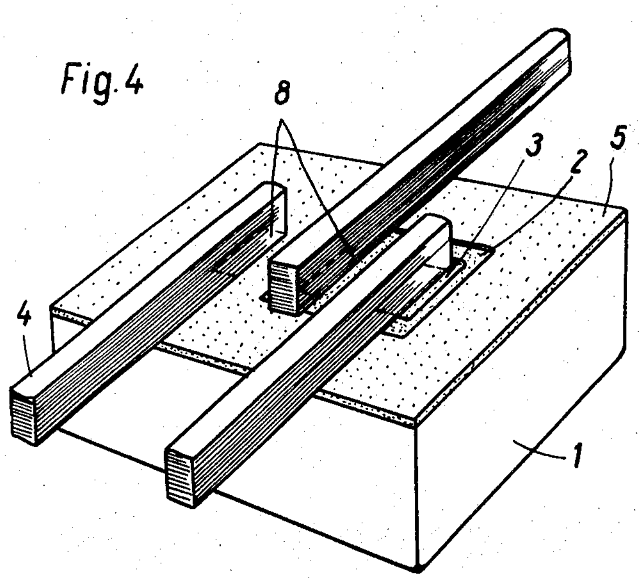
FIG. 4 is a perspective view of a finished transistor device divided from the semiconductor wafer.

The channels 7, extending parallel and at right angles to one another, are between the individual semiconductor components and determine, by their width, the length of the projecting portion of the conducting paths 4 in the finished semiconductor device as seen in FIG. 4. FIG. 3 also shows a perspective view of the partially sawn rear surface of the semiconductor wafer 1. Finally, hydrofluoric acid, hydrochloric acid, nitric acid or a mixture of these acids is sprayed onto this surface until the residual thickness of the semiconductor wafer has been etched through in the channel 7 and the semiconductor wafer disintegrates into its individual parts as shown in FIG. 4.

In the finished transistor device shown in FIG. 4, the contact-making windows 8 are indicated in broken lines. The collector conducting-path and the emitter conducting-path project beyond the semiconductor body at one side, while the base conducting-path extends in the opposite direction and projects beyond the semiconductor body.

Figure 5:
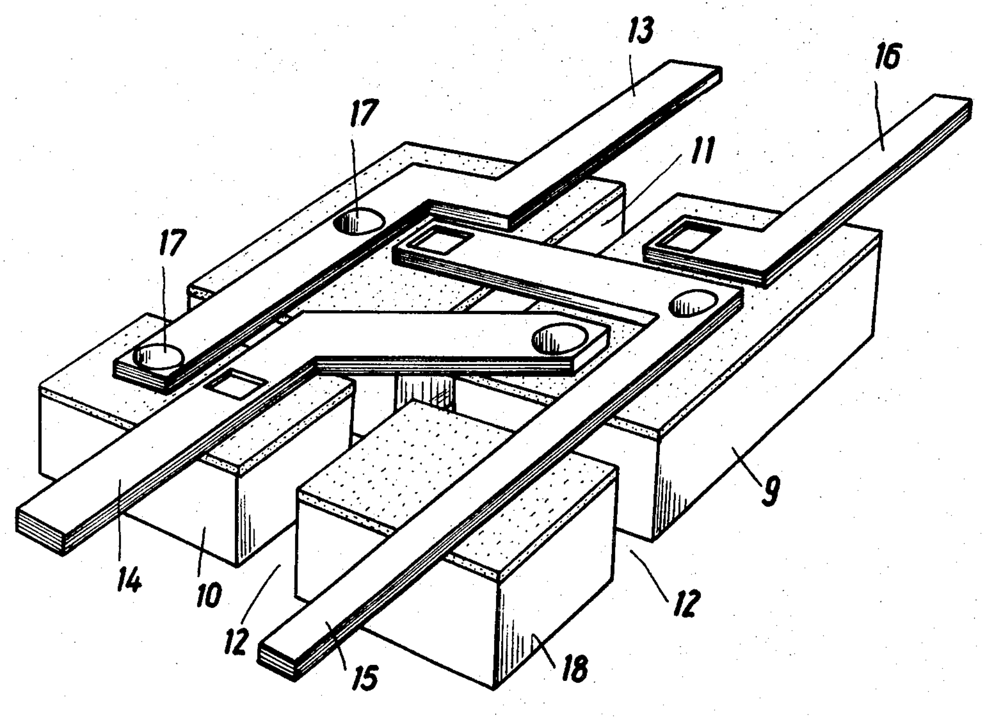
FIG. 5 is perspective view of an integrated semiconductor circuit produced by the method of the invention.

FIG. 5 shows an integrated semiconductor circuit produced by the method according to the invention, namely a diode bridge or Graetz circuit. The four silicon semiconductor bodies 9, 10, 11 and 18 have n-type doping, for example, and are covered with a layer 5 of silicon dioxide. Small regions of p-type conductivity are diffused into the three semiconductor bodies 9, 10 and 11 and are electrically connected, by the contacts, which are shown circular, to the conducting paths originating from the contacts. The contacts 19, which are illustrated as rectangular, connect the basic body of n-type conductivity to the beam-lead conducting paths 14 and 16 which are 10 to 15 μm. thick and project beyond the semiconductor body. The recesses 12 between the four semiconductor bodies 9, 10, 11 and 18 have been produced by sawing the rear surface of the original semiconductor body and subsequent spray etching. The semiconductor body 18 results from the manufacturing process and does not in itself, have any electrical function. Nevertheless, it is mechanically connected to the electrically functional semiconductor bodies 9, 10 and 11 through the conducting paths 15. The ends of the conducting paths 13, 14, 15 and 16 projecting beyond the semiconductor body likewise result from the use of the method, according to the invention, in dividing up a semiconductor wafer which contains a plurality of diode bridge circuits.

The method according to the invention, on the other hand, has the advantage that an etching mask can be dispensed with entirely. The semiconductor wafer is partially sawn from the surface opposite to the conducting paths down to a residual thickness of 30 μm., for example, with a diamond or wire gang saw and then completely divided, for example by spraying an etching liquid over the rear surface of the semiconductor wafer.

The method according to the invention has the important advantage that masking processes, and the associated complicated registering processes, are eliminated in the division of a semiconductor wafer. Furthermore the etching period can be kept relatively short because the greater part of the semiconductor material to be etched has been removed, before the etching process, in a sawing process which is technologically easy to master. All parts of the rear surface of the semiconductor wafer are attached uniformly during the etching. Since the semiconductor material in the channels is only about 30 μm. thick, however, it is immaterial, as regards the mechanical stability of the finished semiconductor body, whether the thickness of this individual semiconductor body is likewise decreased by 30 μm. during the etching.

It will be understood that the above description of the present invention is susceptible to various modifications, changes and adaptations.

What I claim as new and desire to secure by Letters Patent of the United States is:

1. A method of dividing a semiconductor wafer containing a plurality of components or circuits at one major surface of said semiconductor wafer and over said one surface of which there extend thick, self-supporting conducting paths which are connected to the electrodes of said components or circuits, comprising sawing grooves into said semiconductor wafer, from the surface opposite the conducting paths, along lines for division of the semiconductor wafer, terminating this sawing only after a major predetermined portion of the semiconductor wafer along said lines has been removed and the residual thickness of the semiconductor wafer along said lines is thin in comparison with the initial thickness of said semiconductor wafer, and etching said semiconductor wafer only on its sawn surface without the use of a mask to divide said semiconductor wafer into individual components.

2. A method as defined in claim 1, wherein the partial sawing of said semiconductor wafer is carried out with diamond gang saws.

3. A method as defined in claim 1, wherein the partial sawing of said semiconductor wafer is carried out with wire gang saws.

4. A method as defined in claim 1, wherein the partially sawn semiconductor wafer is divided by spray etching.

5. A method as defined in claim 4, wherein an etching fluid consisting of one or more of hydrofluoric acid, hydrochloric acid and nitric acid is used for etching the semiconductor wafer.

6. A method as defined in claim 1, wherein a semiconductor wafer about 220 μm. thick is partially sawn down to the residual thickness of about 30 μm. at the sawn points.

7. A method of dividing a semiconductor wafer containing a plurality of components or circuits on one face of the semiconductor wafer, comprising sawing grooves into the semiconductor wafer from a face of the wafer opposite said one face along lines for the division of the semiconductor wafer, terminating this sawing only after a major predetermined portion of the semiconductor material along said lines has been removed and the remaining semiconductor material along said lines is thin in relation to the remainder of the semiconductor wafer, and spray etching the semiconductor wafer on its sawn face without the use of a mask to divide the wafer into individual components.

References Cited

UNITED STATES PATENTS

| | | | |
|---|---|---|---|
| 2,740,699 | 4/1956 | Koury | 156—17 |
| 3,054,709 | 9/1962 | Freestone et al. | 156—17 |

JACOB H. STEINBERG, Primary Examiner

U.S. Cl. X.R.

156—17; 29—583